(12) United States Patent
Ogasawara et al.

(10) Patent No.: US 9,608,250 B2
(45) Date of Patent: Mar. 28, 2017

(54) WIRE ARRANGEMENT BODY, BUSBAR MODULE AND POWER-SUPPLY UNIT

(75) Inventors: Shigeyuki Ogasawara, Makinohara (JP); Keizo Aoki, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 1132 days.

(21) Appl. No.: 12/858,473

(22) Filed: Aug. 18, 2010

(65) Prior Publication Data
US 2011/0064986 A1   Mar. 17, 2011

(30) Foreign Application Priority Data

Sep. 17, 2009   (JP) .................................. 2009-215510

(51) Int. Cl.
| | |
|---|---|
| H01M 2/22 | (2006.01) |
| H01M 2/20 | (2006.01) |
| H01B 7/00 | (2006.01) |
| H02G 5/00 | (2006.01) |
| H05K 5/02 | (2006.01) |
| H02G 3/04 | (2006.01) |

(52) U.S. Cl.
CPC .............. *H01M 2/206* (2013.01); *H01M 2/22* (2013.01); *H02G 3/0418* (2013.01); *H05K 5/0226* (2013.01)

(58) Field of Classification Search
CPC ...... H01M 2/22; H01M 2/206; H02G 3/0418; H05K 5/0226
See application file for complete search history.

(56) References Cited

U.S. PATENT DOCUMENTS

| | | | |
|---|---|---|---|
| 6,290,552 B1 * | 9/2001 | Saito et al. | 439/736 |
| 6,376,768 B1 | 4/2002 | Saito et al. | |
| 6,935,020 B2 | 8/2005 | Ikeda | |
| 7,554,819 B2 * | 6/2009 | Chen et al. | 361/826 |

FOREIGN PATENT DOCUMENTS

| | | |
|---|---|---|
| JP | 64037319 | 3/1989 |
| JP | 02118415 | 9/1990 |
| JP | 8-251756 A | 9/1996 |
| JP | 2001128337 A | 5/2001 |

(Continued)

OTHER PUBLICATIONS

Office Action dated Jan. 28, 2013 issued by the State Intellectual Property Office of P.R. China in counterpart Chinese Patent Application No. 201010286931.4.

(Continued)

*Primary Examiner* — Jayprakash N Gandhi
*Assistant Examiner* — Jacob Crum
(74) *Attorney, Agent, or Firm* — Sughrue Mion, PLLC

(57) ABSTRACT

A wire arrangement body includes: a wire arrangement groove portion of a groove shape that receives one or more wires; a lid portion that is rotatably connected to the wire arrangement groove portion about a first hinge and covers the wire arrangement groove portion so as to seal a groove opening of the wire arrangement groove portion; and a wire drawing piece that is rotatably connected to the lid portion about a second hinge. The wire arrangement body is provided so that a rotation axis of the second hinge crosses at a right angle to a rotation axis of the first hinge.

6 Claims, 8 Drawing Sheets

(56) References Cited

FOREIGN PATENT DOCUMENTS

| JP | 2005218290 A | 8/2005 |
|---|---|---|
| JP | 2009-43637 A | 2/2009 |
| WO | 2009/022521 A1 | 2/2009 |

OTHER PUBLICATIONS

Communication of Office Action issued Jun. 28, 2013; The Patent Office of the People's Republic of China; corresponding in application No. 201010286931.4.
Office Action dated Nov. 19, 2013, issued by the Japan Patent Office in corresponding Japanese Application No. 2009-215510.

\* cited by examiner

WIRE ARRANGEMENT BODY, BUSBAR MODULE AND POWER-SUPPLY UNIT

BACKGROUND OF THE INVENTION

1. Technical Field

The present invention relates to a power-supply unit that is used in hybrid automobiles, electric automobiles or the like, a busbar module that constitutes the power-supply unit and a wire arrangement body that constitutes the busbar module.

2. Background Art

For example, a power-supply unit that is shown in JP-A-2009-43637 (WO 2009/022521A1) is mounted in various automobiles such as electric automobiles that run using an electric motor, hybrid automobiles that run using an engine and an electric motor together and the like, as the electric power source of the electric motor. The power-supply unit includes a battery assembly having a plurality of batteries in which a positive electrode is provided in one end and a negative electrode is provided in the other end, and the positive electrode and the negative electrode are alternatively arranged adjacent to each other; and a busbar module that is overlapped in a surface in which the electrodes of the battery assembly are provided.

An example of the busbar module that is used in the power-supply unit is shown in FIG. 7 to FIG. 9C. The busbar module 101 as shown in each drawing includes a plurality of busbars 103 that connects between the electrodes of the adjacent batteries of the battery assembly not shown in the drawings so as to connect a plurality of batteries in series, a plurality of terminals 104 that is overlapped in each busbar 103 and are simultaneously connected to the electrode of each battery so as to be used for detecting the voltage of the battery, a plurality of wires 105 attached (connected) in each terminal 104, and a plate 106 as a wire arrangement body receiving a plurality of busbars 103, a plurality of terminals 104 and a plurality of wires 105. Also, in FIG. 7 and FIG. 8, a plurality of wires 105 is omitted. And, an arrow X in FIG. 7 and FIG. 8 shows the arrangement direction of a plurality of batteries.

The plate 106 includes a plurality of first receiving portions 160, a plurality of second receiving portions 164 as wire arrangement groove portions, a plurality of third receiving portions 168 and a plurality of lid portions 167.

The first receiving portion 160 is formed substantially in a tank shape including a bottom wall portion having a rectangular shape, and a peripheral wall portion that is vertically disposed from the surrounding edge of the bottom wall portion, so that the busbars 103 and terminals 104 are received in the first receiving portion 160. Also, a plurality of the first receiving portions 160 is aligned in a row so that the longitudinal direction thereof follows along the arrangement direction (the arrow X direction) of a plurality of batteries. Also, the adjacent first receiving portions 160 are connected to each other.

The second receiving portion 164 is formed in groove shape having a substantially U-shaped cross section, and a plurality of wires 105 is received in the second receiving portion 164. A plurality of the second receiving portions 164 is adjacent to each other and aligned in a row so that the longitudinal direction thereof follows along the arrangement direction (the arrow X direction). A row including a plurality of second receiving portions 164 is arranged with a gap and in parallel to the row including a plurality of first receiving portions 160. Also, a plurality of the first receiving portions 160 and a plurality of the second receiving portions 164 are communicated by a plurality of the third receiving portions formed as a tank shape.

The lid portion 167 is formed in the rectangular shape and covers the second receiving portion 164 so as to close the groove opening 198 of the second receiving portion 164. In the lid portion 167, one of both edge portions (the long side portions) facing each other along the width direction (the arrow Y direction orthogonal to the longitudinal direction (the arrow X direction)) is connected to the second receiving portion 164 through the first hinge 191. The lid portion 167 is provided in the second receiving portion 164 to be opened/closed about the first hinge 191 as the center of the rotation.

Also, a lock click 194 that engages with the click receiving portion 193 provided on the outer surface of the second receiving portion 164 is provided in the other edge portion of the lid portion 167. The lock click 194 engages with the click receiving portion 193 so that the state in which the lid portion 167 is covered by the second receiving portion 164 is maintained (in other words, closed).

Also, a plurality of notch portions 195 that has a substantially rectangular shape is provided in the other edge portion of the some lid portions 167 so as to take out the wire 105 that was arranged in the second receiving portion 164. Generally, the wire 105 is taken out from the end opening 199 of the second receiving portion that is arranged in the end of a plurality of the second receiving portions 164 being aligned in a row, however for example, in the arrangement position of the power-supply unit provided on the automobiles, the wire is taken out from the second receiving portion 164 that is arranged in near the center, so that there is a case that the wire 105 can be easily arranged in automobiles and the like. For this reason, the notch portion 195 is provided.

The wire drawing piece 196 is connected to the bottom edge of the notch portion 195 (in other words, the edge portion facing to the opening of the notch portion 195), through the second hinge 192. The wire drawing piece 196 is rotatably provided about the second hinge 192 as the center of rotation in the lid portion 167. A plurality of wires 105 that is taken out through the notch portion 195 from the second receiving portion 164 is attached to the wire drawing piece 196 by the tape 197 as a constraining member. Thus, the wire drawing piece 196 supports the plurality of wires 105 so that the plurality of wires 105 follows along a predetermined direction (the direction from the rear side to the front side in FIG. 8 or the Z direction in FIGS. 9A to 9C).

Thus, in the above described busbar module 101, the plurality of wires 105 is received and arranged in the second receiving portion 164 in which the groove opening 198 is sealed by the lid portion 167, so that the wires can be protected from the contact with the other members or the impact from the outside and the disadvantage of the cut, short or the like of the plurality of wires 105 can be prevented.

However, in the busbar module 101 (that is, plate 106), the first hinge 191 and the second hinge 192 are arranged in parallel along X direction (front side-rear side direction in FIGS. 9A to 9C), so that usually, a plurality of wires 105 is received in the second receiving portion 164 as shown in FIG. 9A, and when the plurality of wires 105 is taken out from the notch portion 195 that is provided in the lid portion 167 and is pulled tight, a tensile force F1 which is pulled upward along the arrow Z direction shown in FIG. 9A is also added to the wire drawing piece 196, thus a rotation force F2 (that is, a force that turns up the lid portion 167 about the first hinge 191 as the center of rotation) that rotates the lid portion 167 about the first hinge 191 as the center of rotation is generated by the force F1, so that there is a concern that the lid portion 167 may be opened. Thus, the lid portion 167 is opened, so that the wire 105 is nipped between the second receiving portion 164 and the lid portion 167 (bite of the wire) as shown in FIG. 9B, or the wire 105 is deviated from the second receiving portion 164 as shown in FIG. 9C, so that it is a problem that a plurality of wires 105 is not protected.

SUMMARY OF THE INVENTION

Thus, the invention pays attention to the above described problem and it is an object of the invention to provide a wire arrangement body, a busbar module and a power-supply unit in which the lid portion that seals the wire arrangement groove portion can not be opened, even in the case that the tensile force acts on the wire drawing piece.

In order to achieve the object, there is provided a wire arrangement body, including: a wire arrangement groove portion of a groove shape that receives one or more wires; a lid portion that is rotatably connected to the wire arrangement groove portion about a first hinge and covers the wire arrangement groove portion so as to seal a groove opening of the wire arrangement groove portion; and a wire drawing piece that is rotatably connected to the lid portion about a second hinge, wherein at least one wire is taken out from the wire arrangement groove portion and supported along the wire drawing piece, wherein the wire arrangement body is provided so that a rotation axis of the second hinge crosses at a right angle to a rotation axis of the first hinge.

There can be provided a busbar module, including: a plurality of busbars that connect respective batteries of a battery assembly having a plurality of batteries to each other; a plurality of wires that is connected to the respective batteries through the plurality of busbars; and a wire arrangement body as defined above, that receives the plurality of wires.

There can be provided a power-supply unit, including: a battery assembly having a plurality of batteries; and a busbar module as defined above, that is attached in an overlapping manner to the battery assembly and connects the respective batteries to each other.

The wire arrangement body may be configured in that the wire drawing piece is provided at an end portion of the lid portion which is orthogonal to the rotation axis of the first hinge.

The wire arrangement body may be configured in that the wire drawing piece is arranged by overlapping with the lid portion so that the at least one wire fixed to the wire drawing piece follows along an extending direction of the first hinge.

According to the above configurations, in the wire arrangement body, the rotation axis of the second hinge that connects the wire drawing piece and the lid portion is provided so as to be orthogonal to the rotation axis of the first hinge that connects the lid portion and the wire arrangement groove portion, so that the rotation force that turns up the lid portion about the first hinge as the center of rotation is not generated even in the case that the tensile force is applied to the wire drawing piece, thus the lid portion that seals the wire arrangement groove portion can not be opened.

BRIEF DESCRIPTION OF THE DRAWINGS

In the accompanying drawings:

FIGS. 9A to 9C are cross sectional views, each showing cross section along A-A line of FIG. 8, in which FIG. 9A is a view showing a state that a plurality of the wires is received in a second receiving portion, FIG. 9B is a view showing a state that the wire is nipped between the second receiving portion and the lid portion, and FIG. 9C is a view showing a state that the wire is deviated from the second receiving portion.

DETAILED DESCRIPTION OF THE EXEMPLARY EMBODIMENTS

An embodiment of a power supply unit according to the present invention is described referring to FIG. 1 to FIG. 6. Also, for convenience of the description, the arrangement direction of each member is shown using an arrow X, an arrow Y and an arrow Z in each drawing. The arrow X, the arrow Y and the arrow Z are orthogonal to one another.

Figure 1:
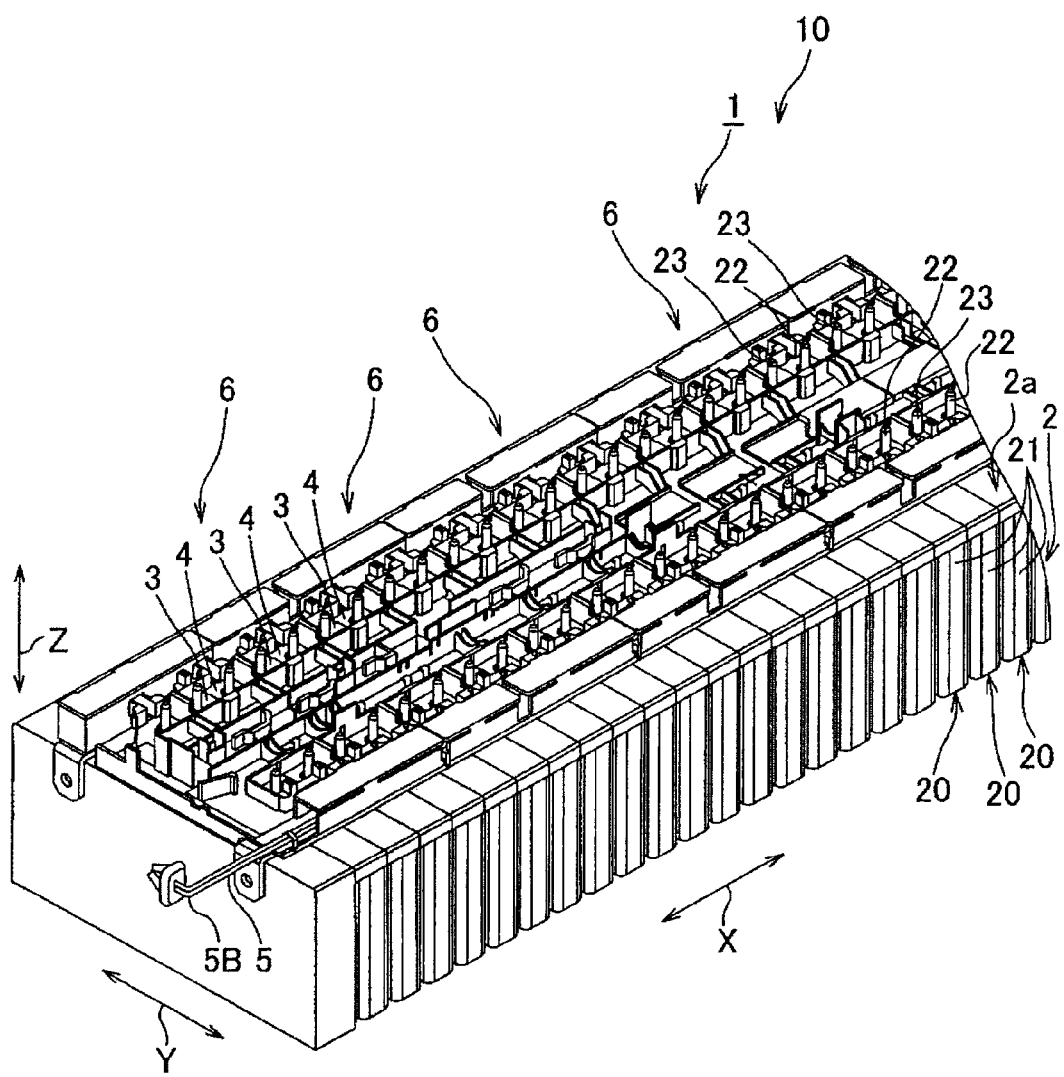
FIG. 1 is a perspective view showing a power-supply unit of a first embodiment of the invention.

A power-supply unit 10 in FIG. 1 includes a battery assembly 2 and a busbar module 1 that is provided overlapped and attached to the battery assembly 2. The power-supply unit 10 is mounted on electric automobiles that runs using a battery motor or on hybrid automobiles that run using an engine and an electric motor jointly and supply electric power to the electric motor.

The battery assembly 2 is constituted by a plurality of batteries 20 that is arranged in a row along one direction (the arrow X direction in FIG. 1) and is fixed one another. Each battery 20 includes a rectangular parallelepiped shape battery main body 21 and a pair of electrodes 22 and 23 that is mounted on the battery main body 21 and respectively projected from one end and the other end of a surface of the battery main body 21. One electrode 22 of the pair of electrodes 22 and 23 is a positive electrode 22 and the other electrode 23 is a negative electrode 23. A pair of electrodes 22 and 23 is formed in a cylindrical shape with an electric conductive metal respectively. Each battery 20 is arranged so that the surface on which a pair of the electrodes 22 and 23 is mounted in the battery main body 21 is to be directed in the same direction (the upper direction in FIG. 1), and the battery main body 21 of the adjacent battery 20 contact each other, also the positive electrode 22 of one battery 20 and the negative electrode 23 of the other battery 20 that is adjacent to the battery 20 are arranged alternatively to be adjacent to each other (in other words, in the order of the positive electrode 22, the negative electrode 23, the positive electrode 22, the negative electrode 23, . . . along the arrow X direction).

Figure 2:
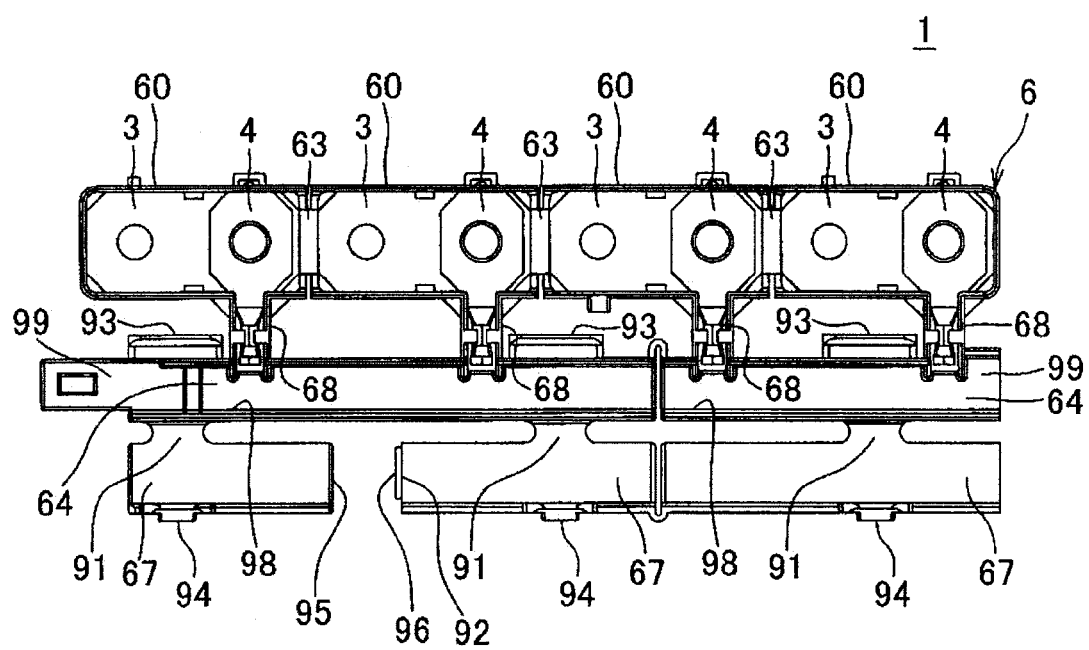
FIG. 2 is a plan view showing a busbar module that is provided in the power-supply unit of FIG. 1.
Figure 3:
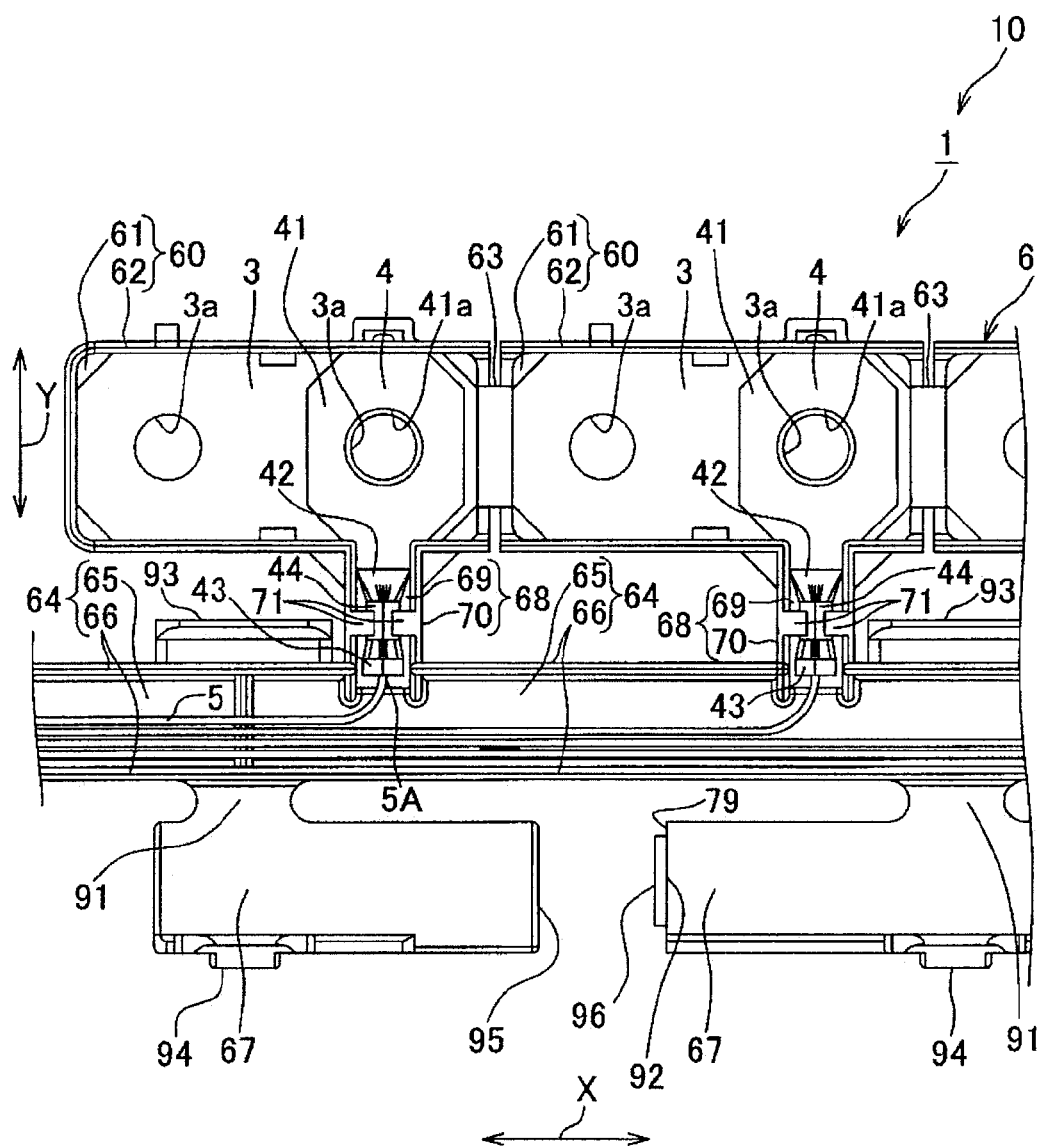
FIG. 3 is a partial enlarged view showing the busbar module of FIG. 2.

The busbar module 1 is connected to the plurality of the batteries 20 in series. As shown in FIG. 2 and FIG. 3, the busbar module 1 includes a plurality of busbars 3, a plurality of terminals 4, a plurality of wires 5 and plates 6 as a plurality of wire arrangement bodies.

The busbars 3 are attached on the positive electrode 22 and the negative electrode 23 adjacent to each other of the battery 20 of the battery assembly 2, so as to connect the respective battery 20 in series. The busbars 3 are obtained by press machining in the conductive metal plate and are provided with a pair of holes 3a in which the positive electrode 22 and the negative electrode 23 adjacent to each other of the battery 20 are passed in the substantially rectangular shaped metal plate. A pair of holes 3a is positioned along the longitudinal direction of the busbars 3 with the same interval as that of the positive electrode 22 and the negative electrode 23 adjacent to each other of the battery 20. Also, the busbars 3 are screwed together with nuts (not shown in the drawings) to the positive electrode 22 and the negative electrode 23 that pass through the holes 3a so as to be attached (fixed) on the battery 20, and are electrically connected to the positive electrode 22 and the negative electrode 23.

Terminals 4 are overlappingly arranged to the corresponding busbars 3, so as to be connected to the positive electrode 22 and the negative electrode 23 adjacent to each other of the batteries 20 via the busbars 3. The terminal 4 is obtained by press machining or the like in the conductive metal plate, and includes a busbar connection portion 41 and a wire attachment portion 42.

The busbar connection portions 41 is overlappingly and electrically connected to the busbars 3 and is formed as a substantially rectangular shape, and a hole 41a is provided in the center portion thereof. The length of each side of the busbar connection portions 41 is substantially the same as or slightly smaller than the short side of the busbars 3. The hole 41a is overlapped in one side of a pair of holes 3a of the busbars 3, so that the positive electrode 22 and the negative electrode 23 of the battery 20 pass through. The busbar connection portion 41 is attached to the battery 20 by a nut in the state that it is overlapped with the busbars 3.

The wire attachment portion 42 is a substantially rectangular plate shaped piece that is connected in parallel with one side of the busbar connection portion 41. A pair of wire crimping pieces 43 that fixes a coating portion coated with electric insulation coating of the one end 5A of the wire 5 is provided on the front end portion of the wire attachment portion 42 as described in below. A pair of the press pieces 44 is provided in the center portion of the wire attachment portion 42, wherein an exposed core wire is attached under pressure to electrically connect to the core wire in one end 5A of the wire as described in below. The hole 41a, a pair of the crimping pieces 43 and a pair of press pieces 44 are linearly arranged in a line.

One end 5A of the wire 5 is attached to the terminal 4 by a pair of wire crimping pieces 43 and a pair of the press pieces 44 of the wire attachment portion 42. In other words, the wire 5 is electrically connected to the terminal 4, thus is connected to the positive electrode 22 and the negative electrode 23 of each battery 20 through the busbars 3.

Also, the terminal 4 is connected to the voltage detection circuit that is provided to an ECU (Electronic Control Unit) not shown in the drawings through the wire 5 that is connected to the terminal 4. Thus, the ECU detects the amount remaining in each battery 20, and electric charge/discharge state or the like of each battery 20. In other words, the terminal 4 functions as the voltage detection terminal that is used in the detection of the voltage on the basis of the electric charge difference (voltage) of the pair of electrodes 22 and 23 in each battery 20, which is detected by the voltage detection circuit.

The wire 5 is a well known coated wire having a conductive core wire and an insulated coating portion that coats the core wire. The insulated coating of the wire 5 is peeled in one end 5A thereof so that the core wire is exposed. One end 5A of the wire 5 is electrically connected to the terminal 4 and the other end 5B of the wire 5 is connected the voltage detection circuit or the like that the ECU includes not shown in the drawings.

The plate 6 has a plurality of first receiving portions 60, second receiving portions 64 as a plurality of wire arrangement groove portions, a plurality of third receiving portions 68, a plurality of lid portions 67 and wire drawing pieces 96 that are integrally formed with one another using synthetic resin, for example.

The first receiving portion 60 includes a bottom wall portion 61 having a substantially rectangular plate shape as the same that of the busbar 3 and a peripheral wall portion 62 that is vertically provided from the edge of the bottom wall portion 61, and is formed in a substantially tank shape. A pair of holes (not shown) that is overlapped with a pair of holes 3a of the busbar 3 is provided in the bottom wall portion 61. The busbar 3 and the terminal 4 are overlapped sequentially in the interior surface (in other words, the surface that is surrounded by the peripheral wall 62) of the bottom wall portion 61. That is to say, each individual busbar 3 and the terminal 4 is received in the inside of the first receiving portion 60. Thus, the positive electrode 22 or the negative electrode 23 of each battery 20 sequentially passes the pair of holes of the bottom wall portion 61 and the holes 3a of busbar 3, and any one of the positive electrode 22 or the negative electrode 23 passes through the hole 4a of the terminal 4. Also, longitudinal direction of the plurality of first receiving portions 60 is aligned in a row along the arrangement direction (the arrow X direction) of a plurality of batteries 20, so that they are connected by the connection member 63 each other.

The connection member 63 is a semi-circular cylindrical shape having a C-shaped cross section and is formed elastically deformably, and a pair of both end portions thereof is connected facing peripheral wall portion 62 in the first receiving portions 60 so that they are adjacent to each other. The connection member 63 is far away or close to the adjacent first receiving portion 60 by elastically deforming and absorbs shape error of each battery 20, the plate 6 or the like, so that the assembly of the electric power source 10 can be improved.

The second receiving portion 64 is formed in groove shape (tank shape) having a U-shaped cross section that includes a bottom wall portion 65 having a long rectangular plate shape and a pair of side wall portions 66 and 66 which are vertically provided from the both ends facing the bottom wall portion 65 in the width direction, and receives a plurality of wires 5 to the inside thereof. The plurality of second receiving portions 64 aligned in a row with the longitudinal direction thereof follows along the arrow X direction. The row including the plurality of second receiving portions 64 is arranged in parallel with a gap between the row including the plurality of first receiving portions 60 along the orthogonal direction (in the arrow Y direction) to the arrow X direction.

The third receiving portion 68 is formed in the tank shape and is provided along the arrow Y direction so as to communicate with the first receiving portion 60 and the second receiving portion 64. The third receiving portion 68 includes a bottom wall portion 69 and a pair of connection wall portions 70, wherein the bottom wall portion 69 connects the bottom wall portion 61 of the first receiving portion 60 and the bottom wall portion 65 of the second receiving portion 64 facing each other and the pair of connection wall portions 70 connects the peripheral wall portion 62 of the first receiving portion 60 and the side wall portion 66 of the second receiving portion 64 facing each other. A wire attachment portion 42 of the terminal 4 and one end 5A of the wire 5 are arranged within the third receiving portion 68.

And, as shown in FIG. 3, the other end 5B of the wire 5 of which one end 5A is received in the third receiving portion 68 is curved substantially 90° and received in the second receiving portion 64. And, a pair of upper wall portions 71 that is protruded to be close each other, is provided in the upper end portion that is apart from the bottom wall portion 69 of the pair of connection wall portions 70. The third receiving portion 68 maintains wire 5 and the wire attachment portion 42 of the terminal 4 between the pair of upper wall portion 71 and the bottom wall portion 69, so as to prevent the wire 5 escaping from the third receiving portion 68.

The lid portion 67 is formed in a rectangular shape and covers the second receiving portion 64 so as to seal the groove opening 98 of the second receiving portion 64. The width of the lid portion 67 is slightly larger than that of the groove opening 98 of the second receiving portion 64. The lid portion 67 is configured in that a part of the end portion of one of both end portions (long side portion) facing each other along the width direction (short side direction) is rotatably connected to the upper end that is distant from the bottom wall portion 65 in one side wall portion 66 of the second receiving portion 64 through the first hinge 91. In other words, the rotation axis of the first hinge 91 is provided along the arrow X direction, so that the lid portion 67 provided in the second receiving portion 64 can be opened or closed about the first hinge 91 as the center of rotation. A lock click 94 is provided in the end portion of the other side of the lid portion 67, wherein the lock click 94 engages with the click receiving portion 93 that is provided in the outer surface of the other side wall portion 66 of the second receiving portion 64. The lock click 94 engages with the click receiving portion 93, so that it maintains the state where the lid portion 67 covers the second receiving portion 64 (in other words, closed state).

A plurality of lid portions 67 is rotatably connected to the corresponding second receiving portion 64 through the first hinge respectively, and the long direction thereof is aligned in a row along the X direction. Also, some lid portions 67 are arranged so as to provide a gap 95 in which the wire is taken out from the second receiving portion 64 between the lid portion 67 and the other lid portion 67 that is adjacent to some lid portions 67. The gap 95 is also a portion in which the lid portion 67 does not cover the groove opening 98 of the second receiving portion 64.

The wire drawing piece 96 is formed in substantially T shape and the end portion corresponding to the vertical column of the T is continuously and rotatably provided in the end portion 79 (short side portion) facing with the gap 95 in the lid portion 67 through the second hinge 92. In other words, the rotation axis of the second hinge 92 is provided along the arrow Y direction, thus the wire drawing piece 96 is provided rotatably about the second hinge 92 as the center of rotation. A plurality of wires 5 that is taken out from the second receiving portion 64 through the gap 95 is attached (in other words, fixed) in the wire drawing piece 96 by the tape 97 as a constraining member. Thus, the wire drawing piece 96 supports a plurality of wires 5 so that the wire 5 follows along the predetermined direction (in other words, the arrow X direction, in the embodiment).

A plurality of plates 6 is aligned in a row along the arrow X direction, and the plates connected to each other by a connection portion not shown in the drawings. Furthermore, the row including the plurality of plates 6 is connected to each other in two lines with a gap along the arrow Y direction. In other words, as shown in FIG. 1, the row including the plurality of second receiving portions 64, the plurality of first receiving portions 60, the plurality of first receiving portions 60, and the plurality of second receiving portions 64 are arranged continuously in parallel sequentially with a gap along the arrow Y direction. Also, the plurality of plates 6 that is connected to each other has a planar shape overall, however they are formed substantially in rectangular shape as the same that the upper surface 2a on which the electrode 22 and 23 of the battery assembly 2 are provided so that it is overlapped in the upper surface 2a.

Figure 5:
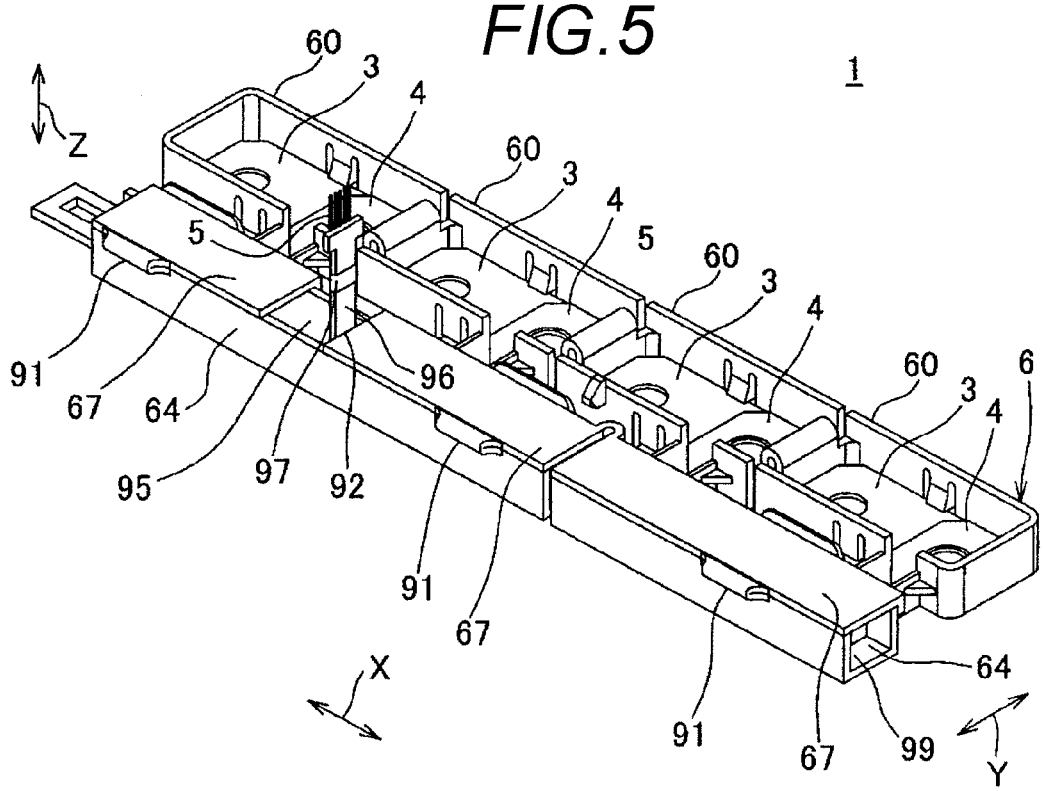
FIG. 5 is a perspective view showing after a lid portion covers a second receiving portion when the busbar module of FIG. 2 is assembled.
Figure 6:
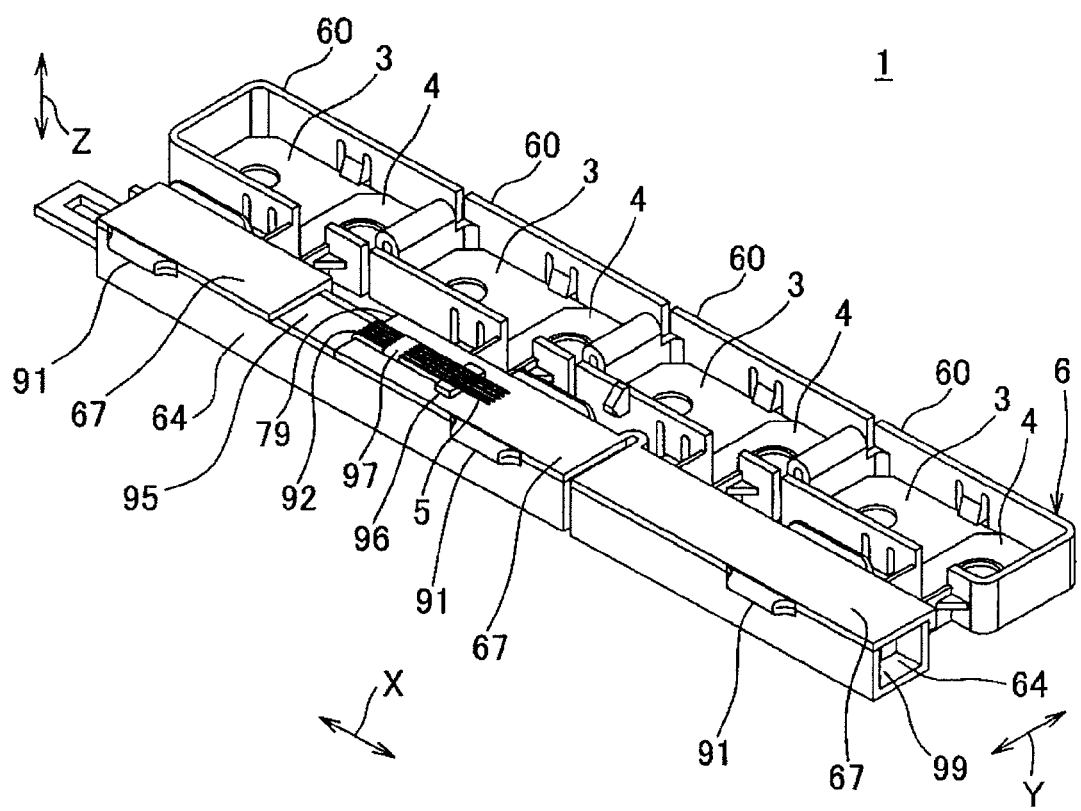
FIG. 6 is a perspective view showing a wire drawing piece is overlapped with a lid portion 67 when the busbar module of FIG. 2 is assembled.
Figure 7:
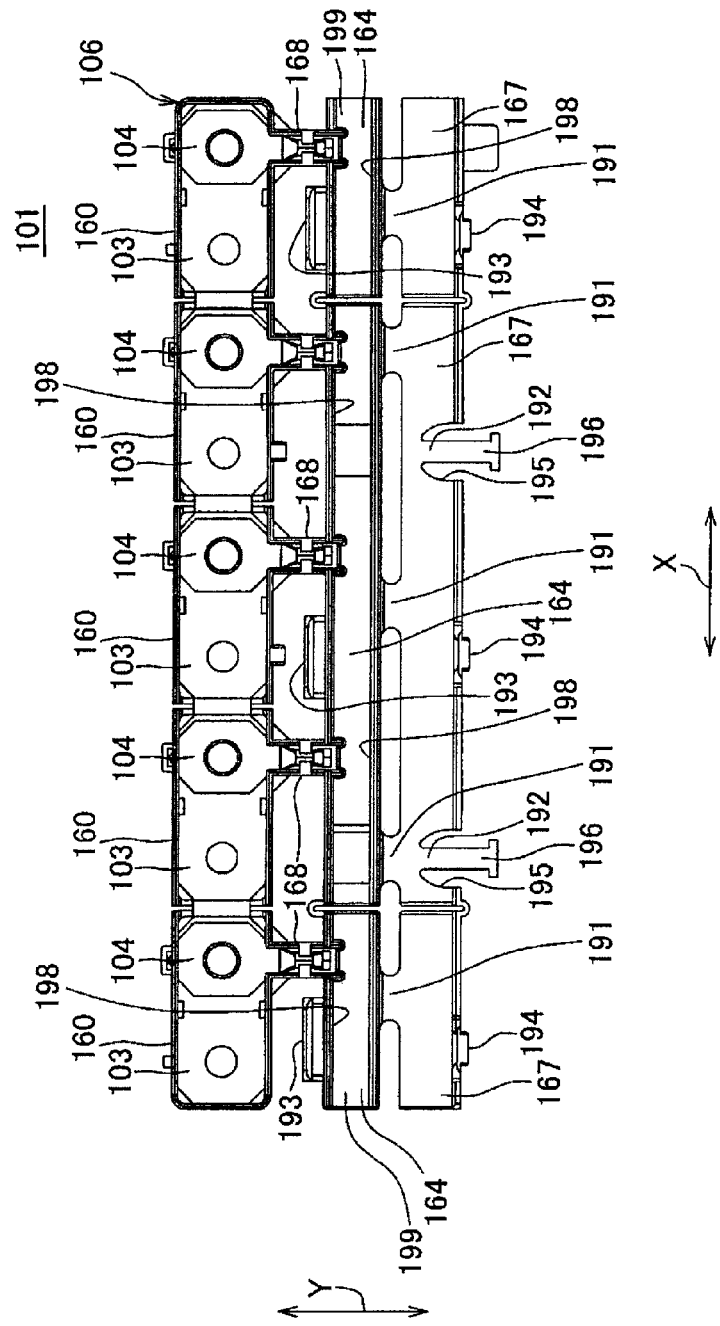
FIG. 7 is a plan view showing a busbar module known in the art.
Figure 8:
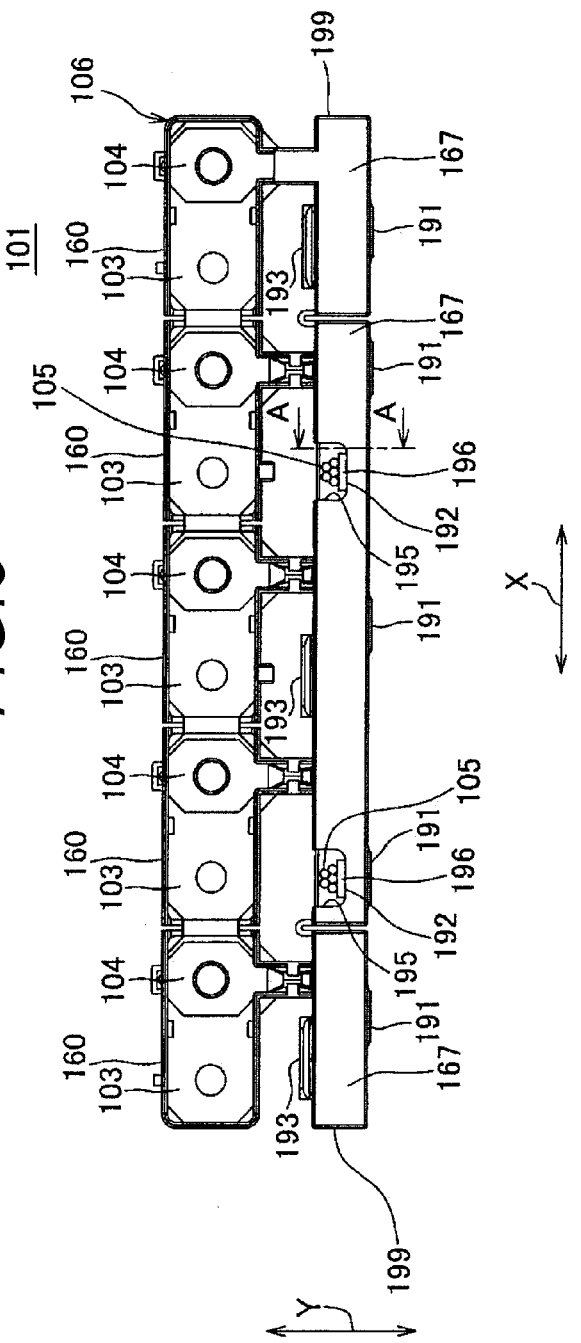
FIG. 8 is a plan view showing after a lid portion covers a second receiving portion in the busbar module of FIG. 7.
Figure 9A:
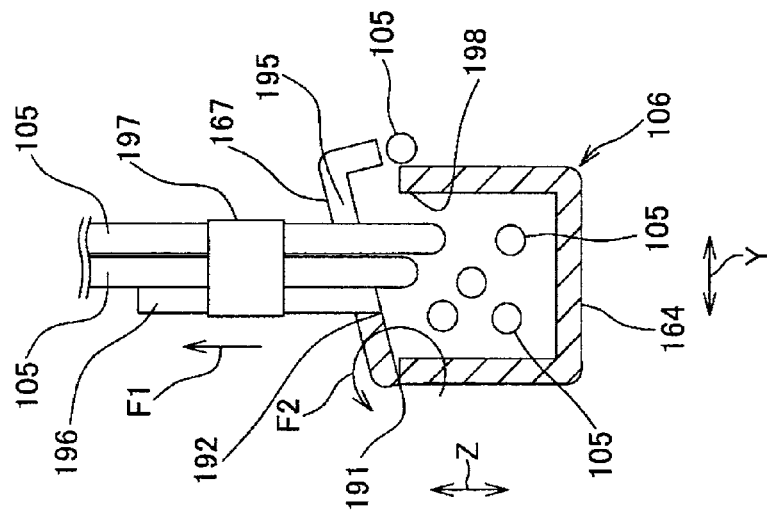
Figure 9B:
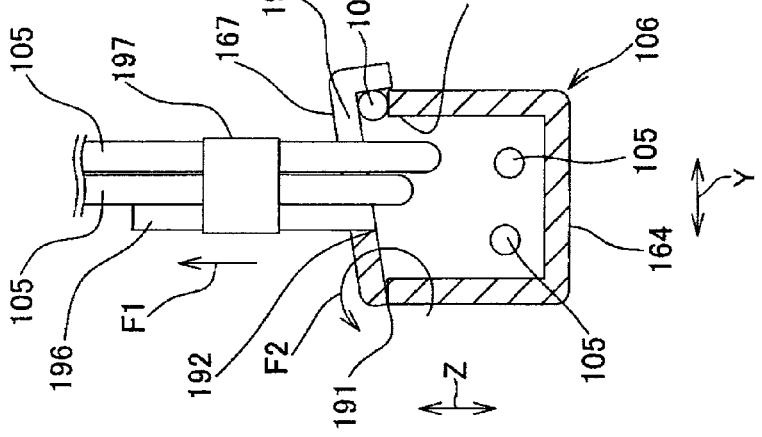
Figure 9C:
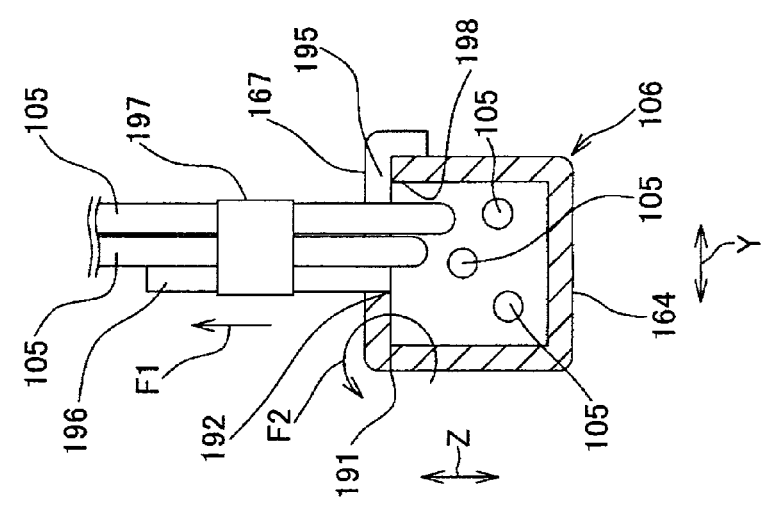

Next, the assembly method of the above described busbar module 1 will be described referring to FIG. 4 to FIG. 6.

Figure 4:
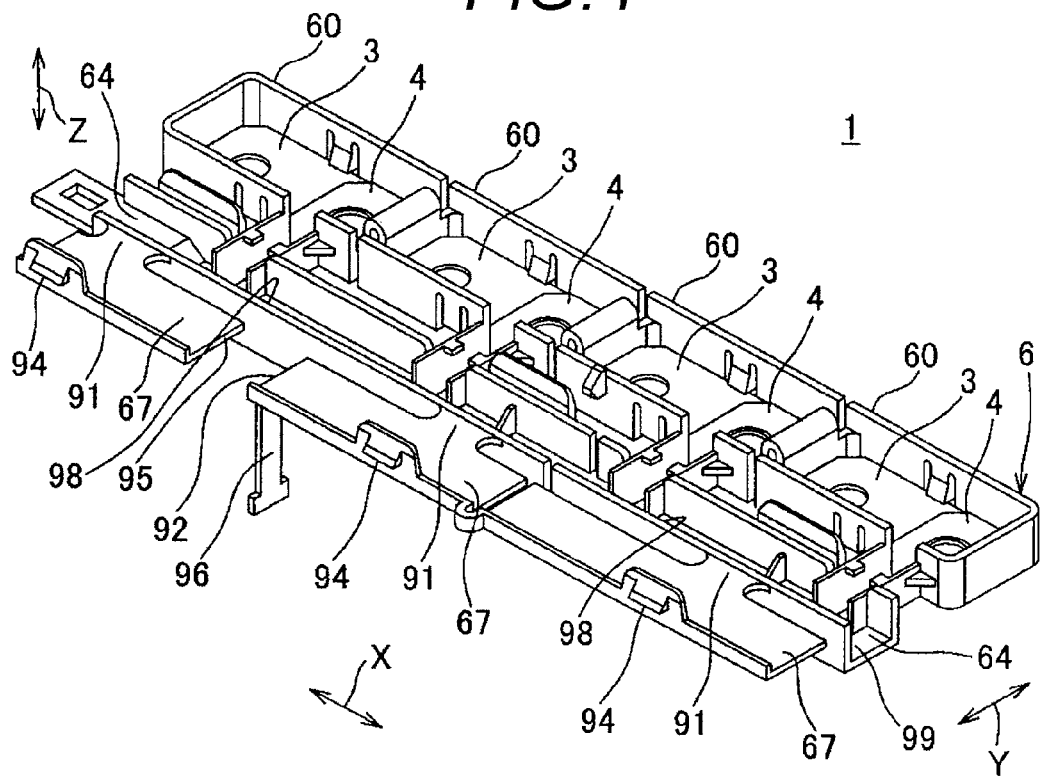
FIG. 4 is a perspective view showing before a lid portion covers a second receiving portion when the busbar module of FIG. 2 is assembled.

First of all, as shown in FIG. 4, the busbar 3 and the terminal 4 to which the wire 5 is already attached are sequentially received in the first receiving portion 60 of the plate 6, and the wire 5 that has been attached to the terminal 4 is received within the second receiving portion 64. Thus, as shown in FIG. 5, each lid portion 67 is rotated about the first hinge 91 as the center of rotation, covers the second receiving portion 64 so as to seal the groove opening 98 of the second receiving portion 64 and engages the click receiving portion 93 and the lock click 94. Thus, some wires 5 are taken out from the gap 95 that is provided between the lid portion 67 and another lid portion 67 adjacent to the lid portion 67, then the wire 5 is fixed with the tape 97 to the wire drawing piece 96 that is provided in the end portion 79 of the lid portion 67 facing to the gap 95. Thus, as shown in FIG. 6, the wire drawing piece 96 is rotated about the second hinge 92 as the center of rotation and the wire drawing piece 96 is arranged by overlapping with the lid portion 67 so that a plurality of wires 5 that is fixed to the wire drawing piece 96 follows along the arrow X direction. Thus, the busbar module 1 is assembled.

Next, description will be made regarding an operation of the invention in the above described busbar module 1.

In the busbar module 1, the second receiving portion 64 is sealed at the groove opening 98 by the lid portion 67 that is continuously and rotatably provided through the first hinge 91. A plurality of wires 5 is arranged in the second receiving portion 64. Some wires 5 are taken out from the gap 95 that is provided between the lid portion 67 and the other lid portion 67 and other wires 5 are taken out from the end opening 99 of the second receiving portion 64. Thus, the wires 5 that are taken out from the gap 95 are fixed in the wire drawing piece 96 that is rotatably connected through the second hinge 92 in the end portion 79 of the lid portion 67 facing the gap 95. Also, the wire drawing piece 96 is arranged so that some wires 5 follow the arrow X direction.

Thus, when the wires 5 are drawn tight, the tensile force also works in the wire drawing piece 96 along the arrow X direction. The rotation axis of the second hinge 92 that connects the wire drawing piece 96 in the lid portion 67 is provided by crossing at right angle with the rotation axis of the first hinge 91 that is the center of rotation of the lid portion 67. Thus, a turning force of the lid portion 67 from the end portion 79 in which the second hinge 92 is provided is generated for the lid portion 67, however a rotation force for turning the lid portion 67 about the first hinge 91 as the center of rotation is not generated, so that it can prevent the lid portion 67 from being opened. Also, as shown in FIG. 5, even in the case that some of wires 5 are taken out by the wire drawing piece 96 along the upward direction (the arrow Z direction), the operation will work similar to that of the above description.

As described above, according to the invention, the rotation axis of the second hinge 92 that connects the wire drawing piece 96 and the lid portion 67 in the plate 6 is provided to be orthogonal to the rotation axis of the first hinge 91 that connects the lid portion 67 and the second receiving portion 64, so that even in the case that the tensile force is applied to the wire drawing piece 96, the rotation force for turning up the lid portion 67 about the first hinge 91 as the center of rotation in the lid portion 67 is not generated, thus the lid portion 67 which seals the second receiving portion 64 cannot be opened. Accordingly, the plurality of wires 5 is certainly received in the second receiving portion 64 so that it can be protected from the contact of the other members or from impact from the outside, thus the disadvantage of the breaking, shorting or the like of the wire 5 can be prevented.

Also, the above described embodiments are nothing more than representative embodiments and the invention is not limited to the embodiments. In other words, a number of modifications can be made to the embodiments without substantially departing from the gist of the invention.

What is claimed is:

1. A wire arrangement body, comprising:
a wire arrangement groove portion of a groove shape that receives one or more wires;
a lid portion that is rotatably connected to the wire arrangement groove portion about a first hinge and covers the wire arrangement groove portion so as to seal a groove opening of the wire arrangement groove portion, the lid portion including a first portion, a second portion, and a gap between the first portion and the second portion; and
a wire drawing piece that faces the gap and is rotatably connected about a second hinge to an end portion of the first portion of the lid portion,
wherein at least one wire is taken out from the wire arrangement groove portion through the gap and supported along the wire drawing piece, and
wherein the wire arrangement body is provided so that a rotation axis of the second hinge crosses at a right angle to a rotation axis of the first hinge.

2. A busbar module, comprising:
a plurality of busbars that connect respective batteries of a battery assembly having a plurality of batteries to each other;
a plurality of wires that is connected to the respective batteries through the plurality of busbars; and
a wire arrangement body as defined in claim 1, that receives the plurality of wires.

3. A power-supply unit, comprising:
a battery assembly having a plurality of batteries; and
a busbar module as defined in claim 2, that is attached in an overlapping manner to the battery assembly and connects the respective batteries to each other.

4. The wire arrangement body according to claim 1, wherein the wire drawing piece is provided at an end portion of the lid portion which is orthogonal to the rotation axis of the first hinge.

5. The wire arrangement body according to claim 1, wherein the wire drawing piece is arranged by overlapping with the lid portion so that the at least one wire fixed to the wire drawing piece follows along an extending direction of the first hinge.

6. The wire arrangement body according to claim 1, wherein the gap completely separates the first portion of the lid from the second portion of the lid.

* * * * *